(12) United States Patent
Tang

(10) Patent No.: US 8,018,343 B2
(45) Date of Patent: *Sep. 13, 2011

(54) IC PACKAGE ANTENNA

(75) Inventor: Chia-Lun Tang, Pa-Te (TW)

(73) Assignee: Auden Techno Corp., Tao-Yuan Hsien (TW)

( * ) Notice: Subject to any disclaimer, the term of this patent is extended or adjusted under 35 U.S.C. 154(b) by 455 days.

This patent is subject to a terminal disclaimer.

(21) Appl. No.: 12/285,388

(22) Filed: Oct. 3, 2008

(65) Prior Publication Data

US 2009/0295675 A1    Dec. 3, 2009

Related U.S. Application Data

(63) Continuation-in-part of application No. 12/127,041, filed on May 27, 2008, now Pat. No. 7,595,731.

(51) Int. Cl.
*G08B 13/14* (2006.01)

(52) U.S. Cl. ............ 340/572.1; 340/572.5; 343/700 MS

(58) Field of Classification Search .......... 343/700 MS, 343/872, 873; 340/572.1, 572.5
See application file for complete search history.

(56) References Cited

U.S. PATENT DOCUMENTS

| | | | | |
|---|---|---|---|---|
| 5,325,784 A * | 7/1994 | Bai et al. | ........................ | 102/293 |
| 7,182,650 B2 * | 2/2007 | Liao et al. | ..................... | 439/680 |
| 7,595,731 B1 * | 9/2009 | Tang | ........................... | 340/572.1 |
| 2007/0080360 A1 * | 4/2007 | Mirsky et al. | ................... | 257/99 |
| 2008/0122726 A1 * | 5/2008 | Levi et al. | ..................... | 343/873 |

* cited by examiner

*Primary Examiner* — Tho G Phan
(74) *Attorney, Agent, or Firm* — Rosenberg, Klein & Lee

(57) ABSTRACT

An IC package antenna of which a metal radiating member is firstly provided on a board to form an antenna base board; the board is formed thereon at least a feed point; and the IC package antenna is packaged with an IC packaging housing and a packaging bottom portion to form an IC chip. The IC packaging housing has a plurality of connecting pins extending outward from inside of itself; wherein the inner end of at least one connecting pin is soldering connected with a feed point of the base board of the antenna. Such an IC package antenna can allow standardized and miniaturized antenna designing, and is applicable to Surface Mount Technology (SMT).

13 Claims, 7 Drawing Sheets

IC PACKAGE ANTENNA

REFERENCE TO RELATED APPLICATIONS

The present patent application is being filed as a Continuation-in-Part of patent application Ser. No. 12/127,041, filed 27 May 2008 now U.S. Pat. No.7,595,731, currently pending.

BACKGROUND OF THE INVENTION

1. Field of the Invention

The present invention relates to an IC package antenna, and especially to an antenna formed by packaging an antenna base board with a housing of an integrated circuit, this allows standardized and miniaturized antenna designing, and is applicable to Surface Mount Technology (SMT).

2. Description of the Prior Art

An antenna is a necessary element for a set of communication equipment, and it is a technique pursued by the art to provide a good antenna structure for use under the requirement of miniaturization and compactness for portable wireless communication equipment.

Installing of electronic elements on a print circuit board presently is performed by Surface Mount Technology (SMT), the way mainly is to print tin paste on the print circuit board, and after electronic parts of a Surface Mount Device (SMD) are placed at correct positions, the tin paste is molten by reflowing to make soldering combining of the electronic parts with the print circuit board; such a technique of combining is not available easily for a conventional antenna, in view of this, it is the subject of the present invention to provide a brand new antenna structure in accompany with applying of Surface Mount Technology (SMT).

SUMMARY OF THE INVENTION

The present invention provides an IC package antenna to get rid of the problem resided in the conventional technique, firstly a metal radiating member is provided on a board to form an antenna base board, the board is formed thereon at least a feed point; the antenna base board is packaged with an IC packaging housing and a packaging bottom portion to form an IC chip. The IC packaging housing has a plurality of connecting pins extending outward from inside of itself, wherein the inner end of one connecting pin is soldering connected with the feed point of the base board of the antenna.

The IC package antenna provided in the present invention can allow standardized and miniaturized antenna designing, and is applicable to Surface Mount Technology (SMT).

The IC package antenna provided in the present invention can further be integrated with a set of radio frequency elements on the base board of the antenna such as a capacitor, an inductance, a wave filter, a switchable switch element, an amplifier etc. to form an adjustable matched circuit with the feature of an antenna or a circuit having the function of radio frequency.

Further, in the process of manufacturing the metal radiating member of the antenna base board of the IC package antenna provided in the present invention, metallic material can be sprayed or electrically plated on the outer surfaces of the antenna base board to form a metal radiating member for the antenna. For example, the metallic material can be sprayed on the outer surfaces of the base board to form a metallic material layer in the first place, then the metallic material layer is cut to make an antenna shape; alternatively, the outer surfaces of the base board can be carved by lasing to form an antenna shape in the first place, then the metallic material can be added in the antenna shape by electric plating.

The present invention can make the metal radiating member on a surface inside of an IC packaging housing, and then make connection of the metal radiating member with connecting pins.

The present invention will be apparent in its structure and characteristics after reading the detailed description of the preferred embodiment thereof in reference to the accompanying drawings.

DETAILED DESCRIPTION OF THE PREFERRED EMBODIMENT

Figure 1:
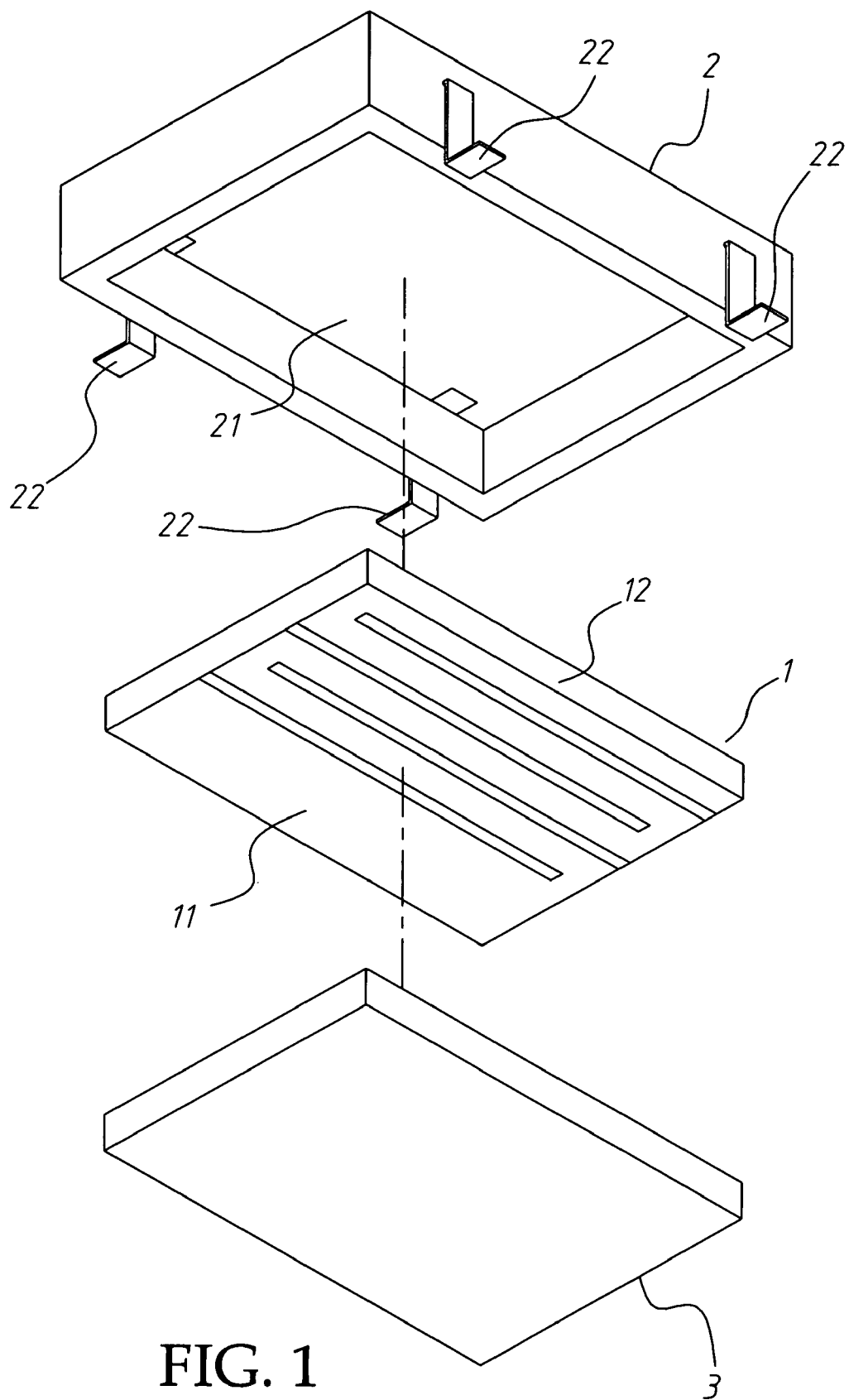
FIG. 1 is an exploded perspective view of the present invention.
Figure 2:
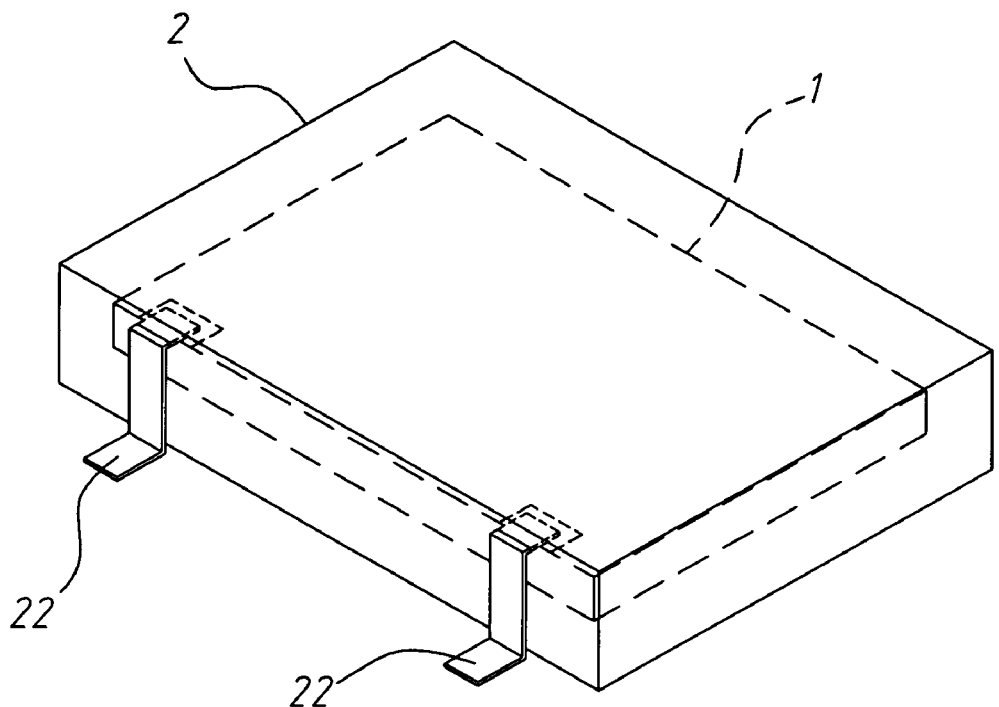
FIG. 2 is a perspective view of the present invention after assembling.
Figure 3:
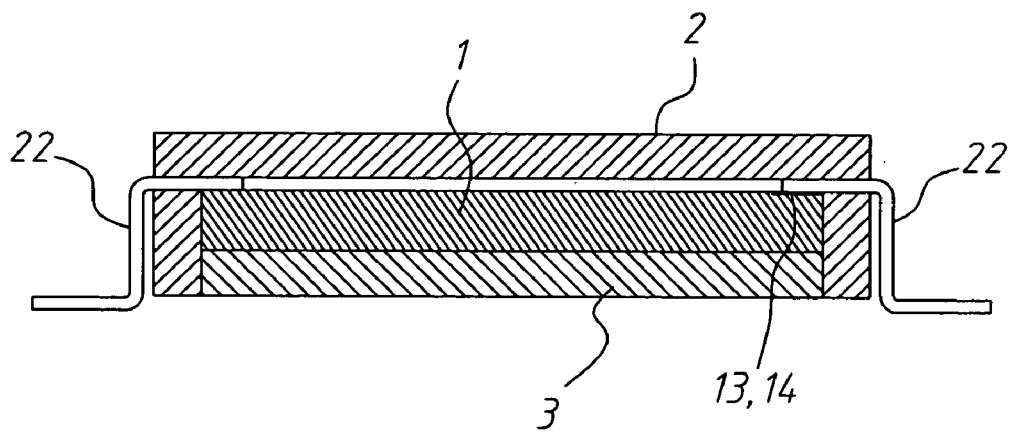
FIG. 3 is a sectional view of the present invention.

Referring to FIGS. 1 to 3, an IC package antenna of the present invention comprises mainly in its structure an antenna base board 1, an IC packaging housing 2 and a packaging bottom portion 3.

Figure 1A:
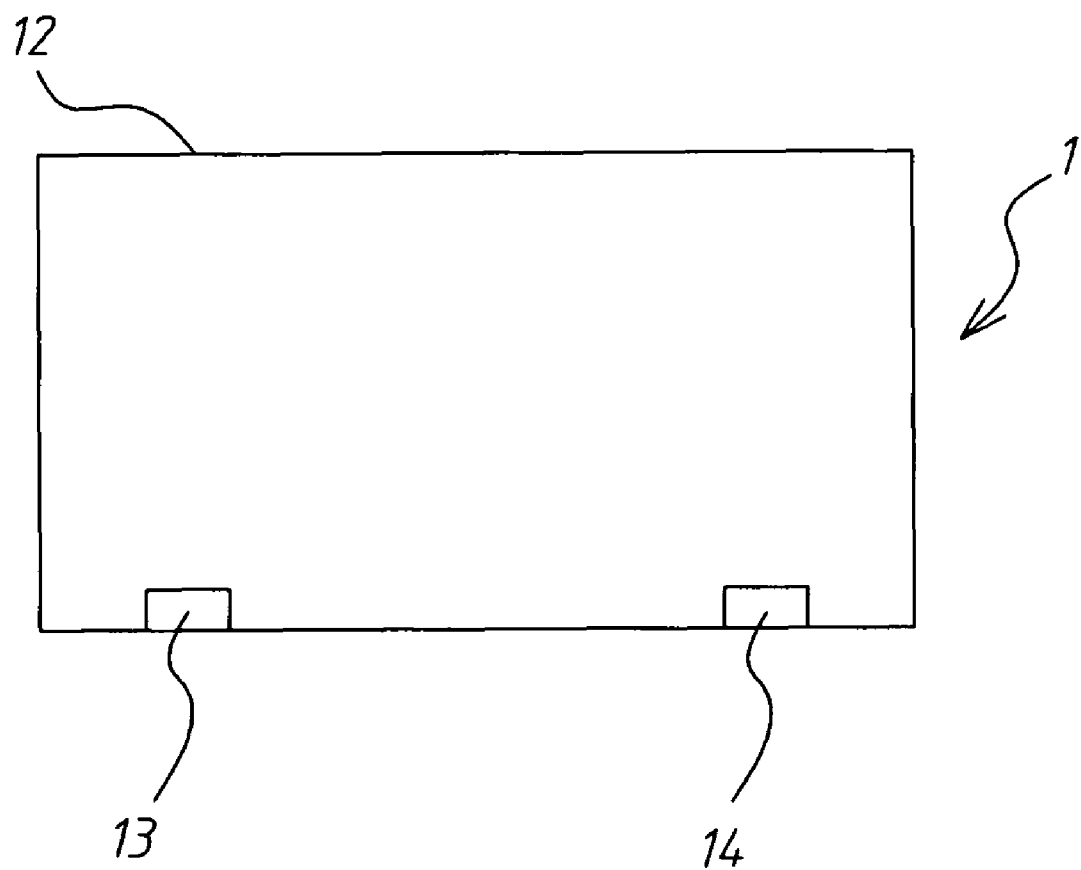
FIG. 1A is a top view of an antenna base board of the present invention.

The antenna base board 1 of the present invention has a metal radiating member 11 provided on a board 12, the board 12 is formed thereon a feed point 13 and a circuit shorting point 14; referring to FIG. 1A, the feed point 13 and the circuit shorting point 14 can be provided on another surface of the board 12 in opposition to the metal radiating member 11, while the board 12 can be a microwave board or a ceramic board.

The IC packaging housing 2 is formed therein a receiving space 21 to receive the antenna base board 1. A plurality of connecting pins 22 are extended outwards from the interior of the housing 2, in which inner ends of two connecting pins 22 are soldering connected with the feed point 13 and the circuit shorting point 14 of the antenna base board 1 (please refer to FIG. 3), while other two connecting pins 22 are used as fixed connecting pins for supporting. The packaging bottom portion 3 covers the bottom of the IC packaging housing 2 to completely package the antenna base board 1.

The IC package antenna provided in the present invention packages the radiating member of the antenna to become an IC chip having the function of an antenna by using the packaging process for IC, this can meet the requirement of standardization and miniaturization for an antenna; and by using the connecting pins to make fixing of position, an SMD is formed that can be applied to SMT.

Figure 4:
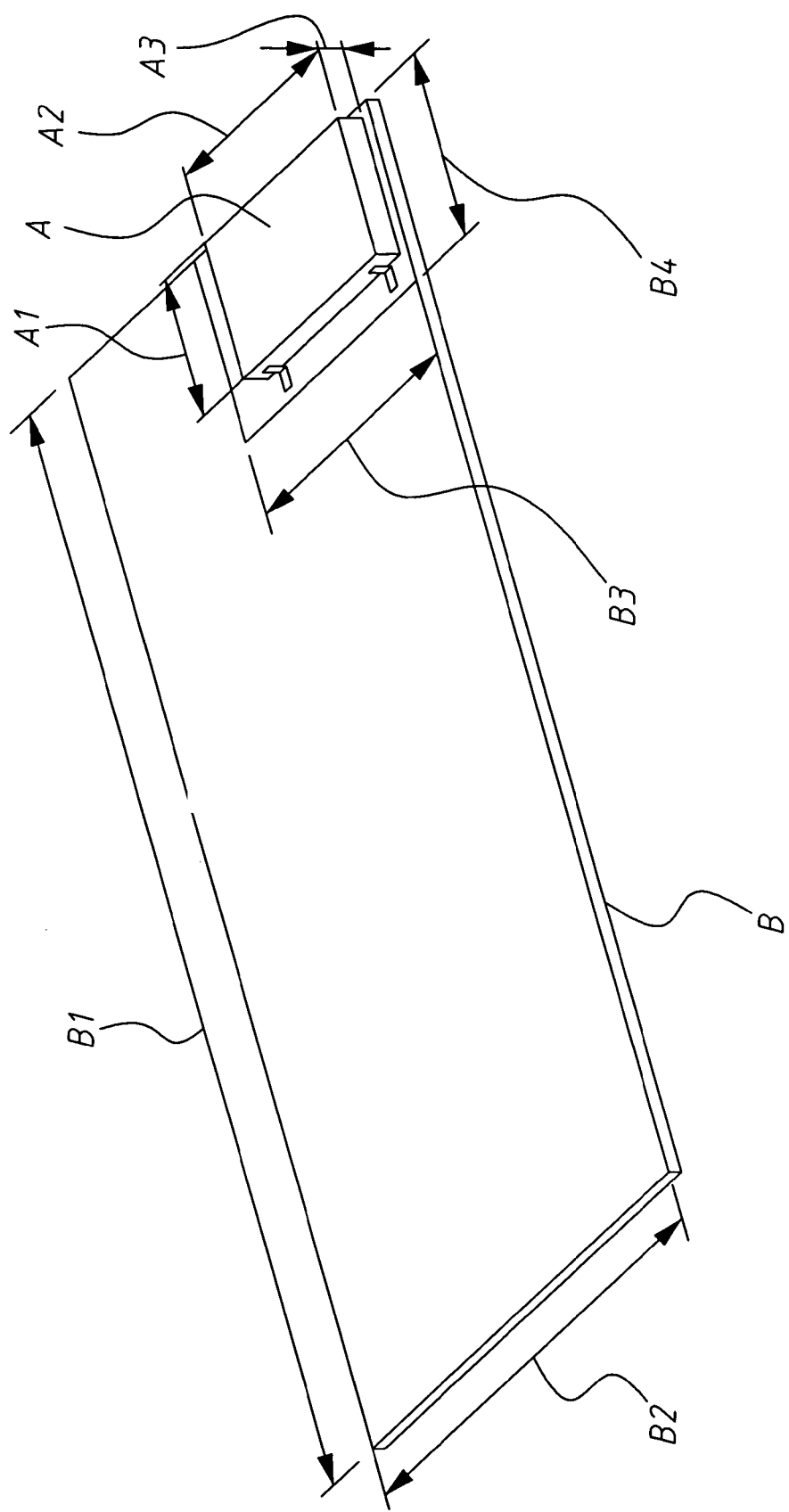
FIG. 4 is an environment test chart of an embodiment of antenna of the present invention.
Figure 6:
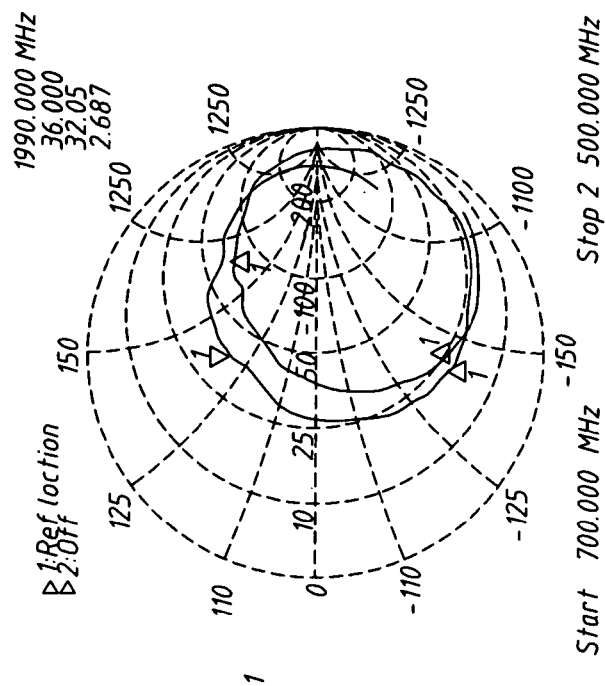
FIG. 6 is a Smith chart showing the result of test on the embodiment of antenna of the present invention.
Figure 5:
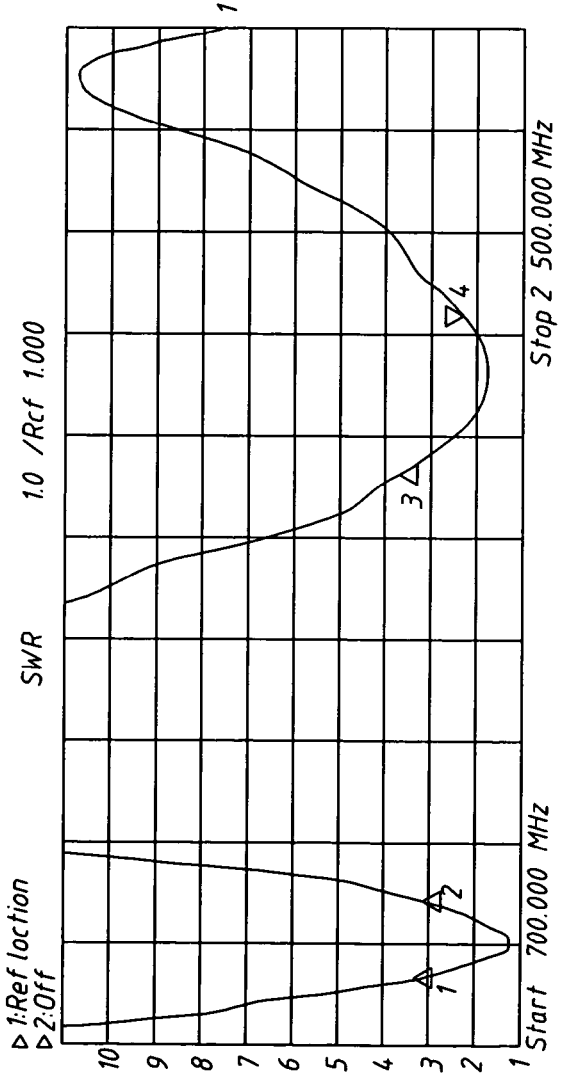
FIG. 5 is a chart showing the result of VSWR test on the embodiment of antenna of the present invention.

And more, please refer to FIG. 4, in which an embodiment of IC package antenna A of the present invention is placed on an electric circuit board B having a grounding surface to form an antenna test environment. In the antenna test environment, data of size of the IC package antenna A are as follows:
A1=12.5 mm
A2=18 mm
A3=2.5 mm While data of size of the grounding surface of the electric circuit board B are as follows:
B1=107 mm
B2=40 mm
B3=25 mm
B4=17 mm FIGS. 5 and 6 show the results of tests on the embodiment of the present invention, in which we can see the efficiencies of the antenna:

|  | Frequency (MHz) | | | | | | |
| --- | --- | --- | --- | --- | --- | --- | --- |
|  | 824 | 880 | 960 | 1710 | 1880 | 1990 | 2170 |
| 3D gain (dBi) | −4.67 | −3.27 | −5.81 | −3.30 | −2.23 | −2.44 | −4.68 |
| Efficiency % | 28.88 | 48.46 | 43.46 | 51.03 | 51.84 | 60.65 | 34.03 |

Therefore we can see from above that the present invention provides a good design of antenna.

Figure 7:
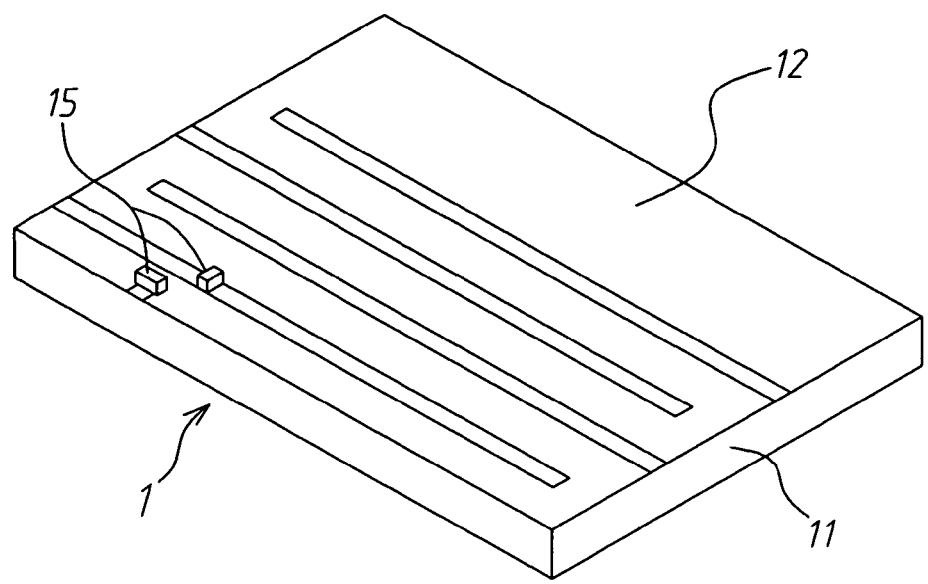
FIG. 7 is a perspective view showing the appearance of another embodiment of antenna base board of the present invention, the antenna base board is provided thereon with a matched circuit (that can adjust the impedance characteristic of the antenna) formed from radio frequency electric circuit elements.

Referring to FIG. 7, in the present invention, the antenna base board 1 is integrated thereon with a set of radio frequency circuit elements 15 to form a matched circuit that can adjust the impedance characteristic of the antenna or to form a circuit that has the function of radio frequency. The radio frequency circuit elements 15 each can be a radio frequency element such as a capacitor, an inductance, a wave filter, a switchable switch element, an amplifier etc.

Figure 8:
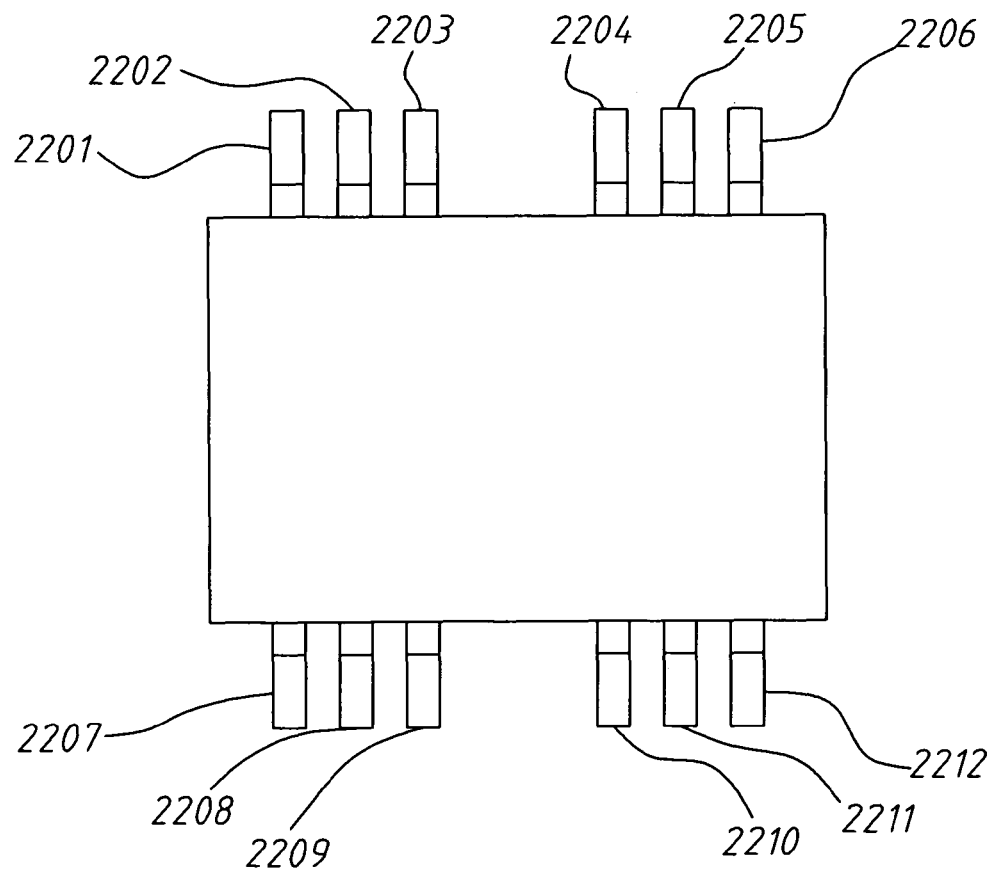
FIG. 8 is a plane view of an embodiment of the present invention having multiple pins; these multiple pins are applied to different ranges of frequency bands for operation.

And more, the present invention can be designed to have thereon a plurality of antenna structures, for instance, to use a multilayer plate on which different frequency bands are provided through designing different antenna frequency bands for different layers; with such a design, the IC package antenna can have multiple working frequency bands. Referring to FIG. 8, the IC package antenna has multiple connecting pins 2201~2212 for being operated with various frequency bands. For example:
connecting pin 2201 is WLAN;
connecting pin 2202 is BT;
connecting pin 2203 is a fixed connecting pin;
connecting pin 2204 is a fixed connecting pin;
connecting pin 2205 is WIMAX; connecting pin 2206 is UWB;
connecting pin 2207 is GSM/DCS/PCS/WCDMA;
connecting pin 2208 is DCS/PCS;
connecting pin 2209 is a fixed connecting pin;
connecting pin 2210 is a fixed connecting pin;
connecting pin 2211 is WCDMA;
connecting pin 2212 is GPS.

Further, in the process of manufacturing the metal radiating member 11 of the antenna base board 1 of the IC package antenna provided in the present invention, metallic material can be sprayed or electrically plated on the outer surfaces of the antenna base board 1 to form the metal radiating member 11 for the antenna. For example, the metallic material can be sprayed on the outer surfaces of the antenna base board 1 to form a metallic material layer in the first place, then the metallic material layer is cut to make an antenna shape; alternatively, the outer surfaces of the antenna base board 1 can be carved by lasing to form an antenna shape the first place, then the metallic material can be added in the antenna shape by electric plating.

Figure 9:
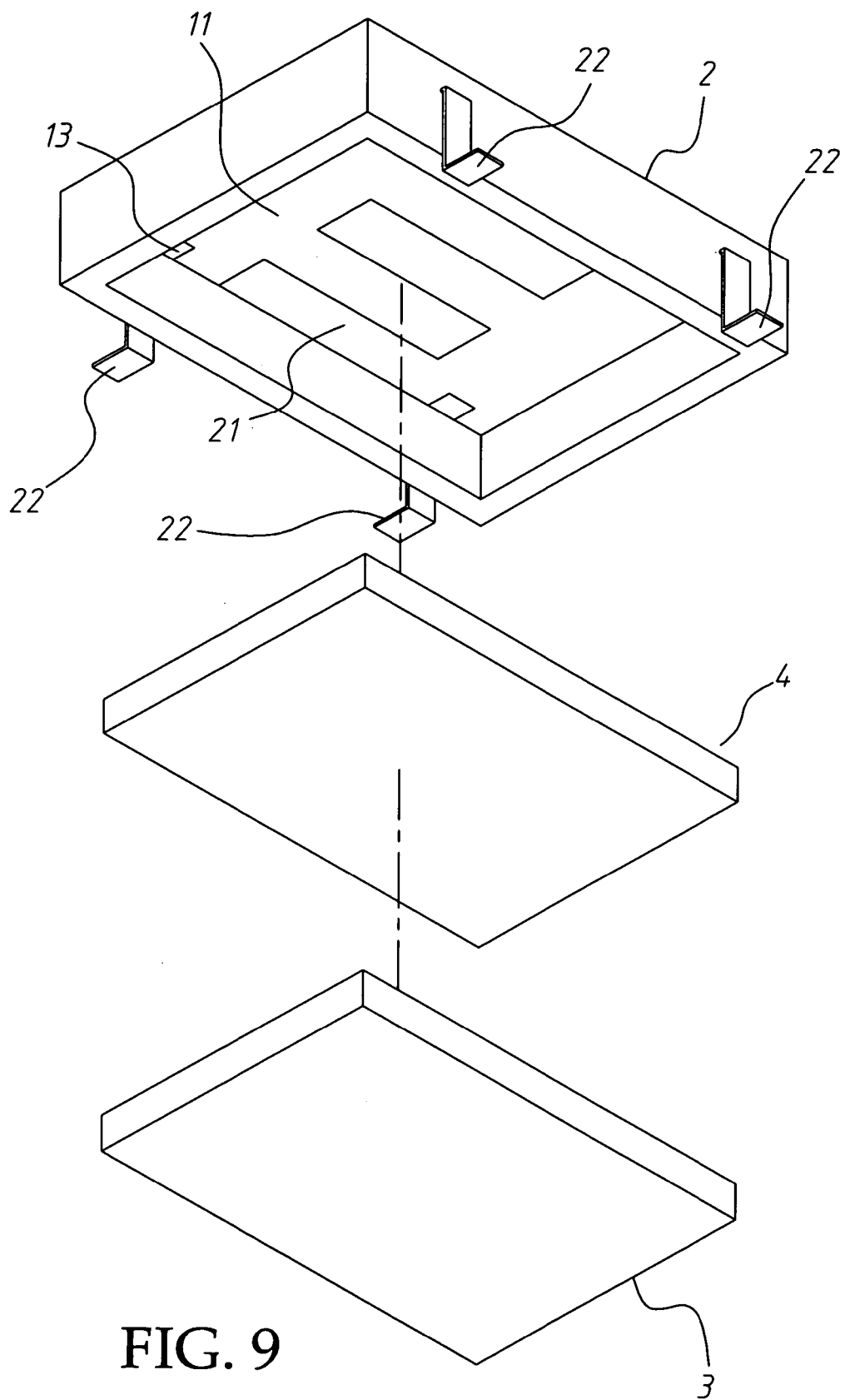
FIG. 9 is another exploded perspective view of the present invention.

According to this process of manufacturing, the metal radiating member 11 can be shaped on a surface inside of an IC packaging housing 2 as is shown in FIG. 9, the IC packaging housing 2 and the packaging bottom portion 3 are same as those for the former embodiment; but the metal radiating member 11 is not provided on an antenna base board 4, rather, the metallic material is sprayed or electrically plated on a surface inside of an IC packaging housing 2 to form the metal radiating member 11 for the antenna in the first place. The metal radiating member 11 at least has a feed point 13 which is soldering connected with an inner end of one connecting pin 22 of the IC packaging housing 2. With such a structure, the IC packaging housing 2 is formed inside of it a receiving space 21 for receiving the antenna base board 4. The feed point 13 of the metal radiating member 11 can be designed to be connected with the antenna base board 4, and then is connected with another connecting pin 22. And more, the metal radiating member 11 can be made by forming an antenna shape by laser carving on a surface inside of an IC packaging housing 2 in the first place, and then by adding the metallic material in the antenna shape by electric plating, this is a simple variation of design of the present invention.

FIG. 9 shows another structure of the present invention, the structure can also have the effect of standardization and miniaturization for an antenna.

Having thus described my invention having high industrial value, what I claim as new and desire to be secured by Letters Patent of the United States is:

1. An IC package antenna comprising:
an antenna base board of which a board is provided on a metal radiating member, said board being formed thereon at least a feed point;
an IC packaging housing being formed therein a receiving space to receive said antenna base board, a plurality of connecting pins being extended outwards from interior of said IC packaging housing, in which an inner end of one of said connecting pins being soldering connected with said feed point; and
a packaging bottom portion covering a bottom of said IC packaging housing to completely package said antenna base board.

2. The IC package antenna as defined in claim 1, wherein said board is a microwave base board or a ceramic base board.

3. The IC package antenna as defined in claim 2, wherein said antenna base board is integrated with a set of radio frequency circuit elements to form a matched circuit to adjust impedance characteristic of said IC package antenna.

4. The IC package antenna as defined in claim 3, wherein each of said radio frequency circuit elements is chosen from a capacitor, an inductance, a wave filter, a switchable switch element and an amplifier.

5. The IC package antenna as defined in claim 4, wherein said antenna base board is designed to have thereon a plurality of antenna structures each with a feed point, said feed points are soldering connected with said connecting pins of said IC packaging housing to provide different frequency bands for different operations.

6. The IC package antenna as defined in claim 1, wherein said antenna structures designed on said antenna base board are designed to provide different frequency bands on different layers of a multilayer plate.

7. The IC package antenna as defined in claim 1, wherein said antenna base board has a circuit shorting point, an inner end of other one of said connecting pins of said IC packaging housing is soldering connected with said circuit shorting point of said antenna base board.

8. The IC package antenna as defined in claim 1, in forming said antenna metal radiating member of said antenna base board, metallic material is sprayed on outer surfaces of said antenna base board to form a metallic material layer in firstly, then said metallic material layer is cut to make an antenna shape.

9. The IC package antenna as defined in claim 1, in forming said antenna metal radiating member of the antenna base board, outer surfaces of said antenna base board is carved by lasing to form an antenna shape firstly, then said metallic material is added in said antenna shape by electric plating.

10. An IC package antenna comprising:
   an IC packaging housing, a plurality of connecting pins being extended outwards from interior of said IC packaging housing;
   a metal radiating member, being shaped on a surface inside of said IC packaging housing, said metal radiating member at least has a feed point which is soldering connected with an inner end of one of said connecting pins of said IC packaging housing; and
   a packaging bottom portion covering a bottom of said IC packaging housing to completely package.

11. The IC package antenna as defined in claim 10, wherein said IC packaging housing is formed therein a receiving space to receive said antenna base board.

12. The IC package antenna as defined in claim 10, in forming said antenna metal radiating member, metallic material is sprayed on a surface inside of said IC packaging housing to form a metallic material layer firstly, then said metallic material layer is cut to make an antenna shape.

13. The IC package antenna as defined in claim 10, in forming said antenna metal radiating member, a surface inside of said IC packaging housing is carved by lasing to form an antenna shape firstly, then said metallic material is added in said antenna shape by electric plating.

* * * * *